(12) United States Patent
Höhnsdorf (10) Patent No.: US 6,750,140 B2
(45) Date of Patent: Jun. 15, 2004

(54) PROCESS FOR PRODUCING CONTACT HOLES ON A METALLIZATION STRUCTURE

(75) Inventor: Falko Höhnsdorf, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/223,649

(22) Filed: Aug. 19, 2002

(65) Prior Publication Data

US 2003/0036227 A1 Feb. 20, 2003

(30) Foreign Application Priority Data

Aug. 17, 2001 (DE) .......................... 101 40 468

(51) Int. Cl.$^7$ .......................... H01L 21/4763
(52) U.S. Cl. .................. 438/637; 438/638; 438/672; 438/675
(58) Field of Search ................. 438/637, 638, 438/692, 693

(56) References Cited

U.S. PATENT DOCUMENTS

| | | | |
|---|---|---|---|
| 4,943,539 A | 7/1990 | Wilson et al. | |
| 5,451,543 A | 9/1995 | Woo et al. | |
| 5,700,737 A | 12/1997 | Yu et al. | |
| 5,935,868 A | 8/1999 | Fang et al. | |
| 6,015,751 A | 1/2000 | Liu | |
| 6,162,722 A | * 12/2000 | Hsu | 438/637 |
| 6,174,800 B1 | 1/2001 | Jang | |
| 6,207,554 B1 | 3/2001 | Xu et al. | |

FOREIGN PATENT DOCUMENTS

JP 08 023 028 A 1/1996

* cited by examiner

*Primary Examiner*—Dung A. Le
(74) *Attorney, Agent, or Firm*—Laurence A. Greenberg; Werner H. Stemer; Ralph E. Locher (57) ABSTRACT

The present invention relates to a process for producing contact holes on a metallization structure, which can be used, for example, to produce electrical contacts between adjacent metallization levels. A dielectric layer is applied to interconnects which are covered with a hard-mask layer that is usually used for patterning the interconnects. Then, contact holes are etched through the dielectric layer, and this step is ended as soon as the hard-mask layer is reached. Then, the hard-mask layer is etched selectively with respect to the dielectric layer, so that the phenomenon where the contact holes break out into the space between adjacent interconnects is minimized. In this way the risk of short circuits is drastically reduced.

12 Claims, 5 Drawing Sheets

PROCESS FOR PRODUCING CONTACT HOLES ON A METALLIZATION STRUCTURE

BACKGROUND OF THE INVENTION

Field of the Invention

The present invention relates to a process for producing contact holes on a metallization structure, which can advantageously be used, for example, to produce electrical contacts between adjacent metallization levels.

During the fabrication of integrated circuits, the electrical lines are generally accommodated in a plurality of metallization levels. The metallization levels are insulated from one another by a dielectric material ("inter layer dielectric", "ILD"). To provide electrical contacts between the individual metallization levels, contact holes are opened up in the dielectric material and are filled with an electrically conductive material.

FIGS. 3 and 4 of U.S. Pat. No. 6,207,554 describe a process for producing a dielectric layer with a low dielectric constant and then for etching a fully landed contact hole on the interconnects, which are covered with sections of a single-layer or multilayer hard mask. The process for etching the contact hole takes place in two stages, the etching-gas mixtures that are indicated evidently also etch the other layer in each case. It can be seen from FIG. 4b of the patent that the contact holes have been etched to beyond the top edge of the interconnects. It is not determined whether the hard-mask layer has been reached in order to then end the first etching step.

U.S. Pat. No. 6,174,800 describes a two-stage etching process in which, during the first etching stage, the contact hole is etched through the dielectric layer, and during the second etching stage, a covering layer that has been applied to the interconnect as an etching stop layer is etched. The second stage is described as sputtering using argon, i.e. not a selective etching process. It is not determined whether the etching stop layer has been reached.

U.S. Pat. No. 5,700,737 discloses a two-stage process for etching a contact hole. The first etching stage takes place selectively with respect to the etching stop layer below it, and consequently, the etching time is not critical. It is not determined whether the hard-mask layer has been reached.

U.S. Pat. No. 4,943,539 describes a process for the two-stage etching of contact holes. In this process, a sacrificial layer, which also serves as an etching stop layer, is additionally arranged above the interconnects and is etched selectively with respect to the interconnects and isotropically, in order to increase the size of the landing area of the contact holes. The second etching step does not take place selectively with respect to the dielectric layer, as shown in FIGS. 3 and 4 of the patent, since back-sputtered material is also removed from the inner surface of the contact-hole in the dielectric layer.

Japanese Patent JP 8-23028 A describes the isotropic etching of a TiN layer that has been applied to an interconnect in order to increase the size of the landing area. It is not determined whether the TiN layer has been reached.

The ongoing miniaturization of the feature sizes and of the integrated circuits gives rise to the general problem that subsequent metallization levels have to be aligned ever more precisely with respect to one another. However, a certain intrinsic misalignment is inevitable when one level is being lithographically mapped onto another. Therefore, the design has to incorporate certain tolerances which ensure that the contacts of one contact hole level can land reliably on the respective interconnects of the metallization level below it. A conventional process for producing a contact hole on a metallization structure is shown, for example, in FIGS. 2A and 2B herein.

Figure 2A:
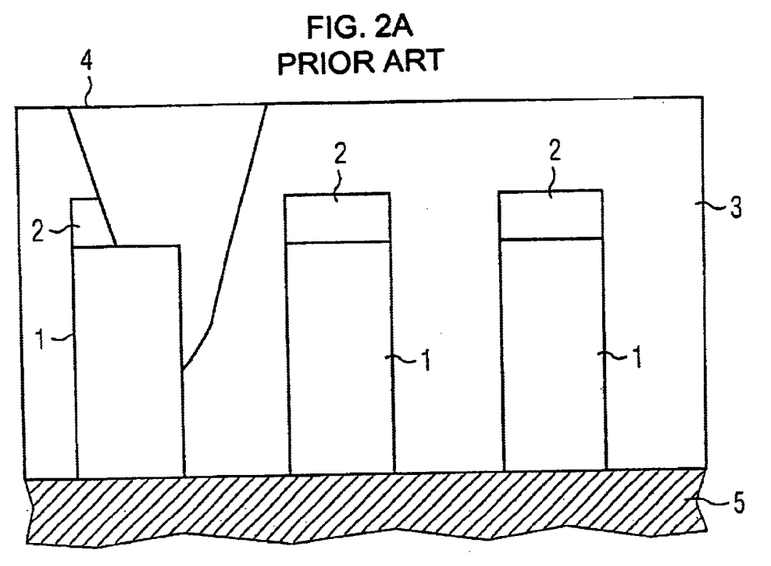
FIGS. 2A and 2B diagrammatically depict the steps involved in a prior art process for producing contact holes.

In FIG. 2A, reference numeral 1 denotes an interconnect of a metallization structure, reference numeral 2 denotes remainders of the hard mask that was used to pattern the interconnect, reference numeral 3 denotes the dielectric material for insulating adjacent metallization levels and adjacent interconnects, reference numeral 4 denotes a contact hole, and reference numeral 5 denotes a substrate surface, for example, a processed semiconductor wafer with component and metallization levels that are separated from one another by insulation layers.

As shown in FIG. 2A, on account of the misalignment of the etching mask used to etch the contact hole, the contact holes 4 do not land accurately on the interconnects, but rather there is an offset. According to the current state of the art in lithography, there is generally an offset in the region of 40 nm, and in the worst possible scenario the offset may amount to more than 100 nm.

Figure 2B:
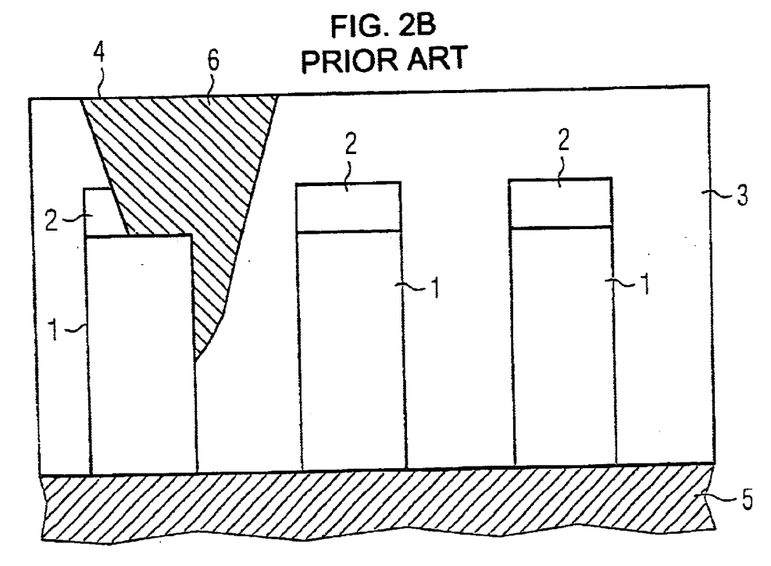

If, as shown in FIG. 2B, the contact hole 4 is filled with an electrically conductive material 6, there is a risk that short circuits will occur between adjacent interconnects.

This drawback has hitherto been minimized by empirically determining the overlap that can be achieved between two lithography levels and taking this overlap into account in the layout of circuit structures, in such a manner that a corresponding metal overlap was observed for an interconnect landing surface of a contact. Hitherto, for a predetermined size of contact hole, the area of the interconnect below it had to be a predetermined amount larger than the landing contact on all sides.

However, this attempted solution cannot be used in conjunction with further miniaturization of the feature sizes, since it predetermines a minimum distance between adjacent interconnects, so that the routing pitch increases. More specifically, to ensure that the distance between the interconnect landing surfaces does not fall below a predetermined distance, it is necessary to maintain a considerable minimum distance between adjacent interconnects.

U.S. Pat. No. 6,015,751 relates to the problem of unlanded contact holes. A metallic layer that is covered with a second dielectric layer is patterned to form interconnects and is covered with a conformally deposited third dielectric layer. Then, a fourth dielectric layer is applied. The contact hole is etched in three stages through each individual dielectric layer, each of the dielectric layers being etched selectively with respect to the adjoining dielectric layers. This process is disadvantageous in that in addition the conformally deposited third dielectric layer is required, in order to prevent the contact hole landing on the first dielectric layer or the contact hole from making contact with adjacent interconnects.

U.S. Pat. No. 5,451,543 also discusses the problem of unlanded contacts. In this document, there is a conformal or non-conformal etching stop layer, which has the disadvantages referred to above. Also, this document does not give any indication of a step of detecting that the hard-mask layer has been reached and ending the first etching stage.

U.S. Pat. No. 5,935,868 likewise describes a process for etching contact holes that are not completely landed on the interconnects.

SUMMARY OF THE INVENTION

It is accordingly an object of the invention to provide a process for producing contact holes on a metallization structure which overcomes the above-mentioned disadvantages of the prior art processes of this general type.

With the foregoing and other objects in view there is provided, in accordance with the invention, a process for producing contact holes on a metallization structure. The process includes: providing the metallization structure with at least one interconnect having a surface covered with a section of a hard-mask layer and configuring the metallization structure on a substrate surface; applying a dielectric layer so that at least a surface of the section of the hard-mask layer is surrounded by the dielectric layer; forming the dielectric layer from a material that is different than a material of the hard-mask layer; etching contact holes through the dielectric layer; making a determination that the hard-mask layer has been reached; in dependence on the determination, ending the step of etching the contact holes through the dielectric layer; and selectively etching the hard-mask layer with respect to the dielectric layer.

In accordance with an added feature of the invention, the step of providing the metallization structure includes: applying a metal layer to all of the substrate surface, applying the hard-mask layer to all of the substrate surface, patterning the hard-mask layer so that the interconnect that will be formed is covered by the hard-mask layer, and etching the metal layer.

In accordance with an additional feature of the invention, the dielectric layer includes a material with a dielectric constant of less than 4.

In accordance with another feature of the invention, the step of etching the contact holes through the dielectric layer takes place anisotropically.

In accordance with a further feature of the invention, the step of selectively etching the hard-mask layer takes place partially isotropically.

In accordance with a further added feature of the invention, the dielectric layer includes carbon-doped silicon oxide, halogen-doped silicon oxide, or a polymer film.

In accordance with a further additional feature of the invention, the step of ending the etching of the contact holes through the dielectric layer takes place after a predetermined time.

In accordance with yet an added feature of the invention, the step of making the determination that the hard-mask layer has been reached includes determining a composition of etching products; and the step of ending the etching of the contact holes through the dielectric layer takes place as a function of the composition of the etching products.

In accordance with a concomitant feature of the invention, after the step of selectively etching the hard-mask layer, electrically conductive material is deposited.

Other features which are considered as characteristic for the invention are set forth in the appended claims.

Although the invention is illustrated and described herein as embodied in a process for producing contact holes on a metallization structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
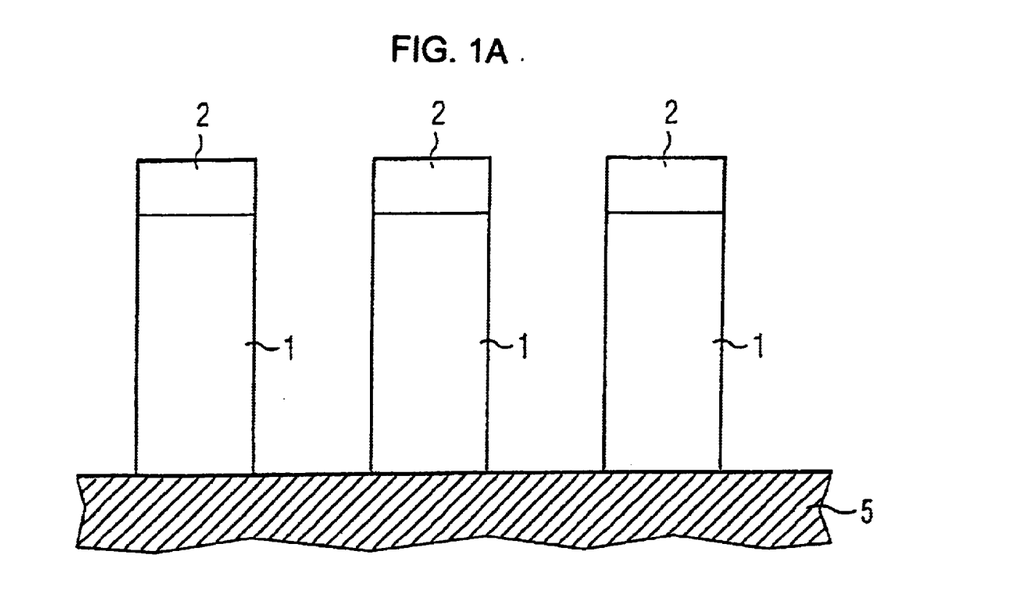
FIGS. 1A to 1D diagrammatically depict the steps involved in an inventive process for producing contact holes.

Referring now to the figures of the drawing in detail and first, particularly, to FIGS. 1A to 1D thereof, the diagrammatic sequence of the inventive process is illustrated. In FIG. 1A, reference numeral 5 denotes a substrate surface, for example, a processed semiconductor wafer with component and metallization levels such as those that are customarily used. However, it will be clear that the substrate surface may also be the surface of any desired substrate, for example, a glass or other insulating substrate or an electrically conductive substrate with an insulation layer applied thereon.

FIG. 1A shows interconnects 1 located on top of the substrate surface 5. Hard-mask material 2 is on the surface of the interconnects 1. The interconnects are generally electrically insulated from the layers below by using an insulation layer.

Below certain feature sizes, metal tracks are patterned using a hard mask, which may consist, for example, of silicon dioxide. A hard-mask layer is built up from a material which can be etched selectively with respect to the metal layer used for the metallization and which is not a photoresist material, i.e. it does not have a photoactive component and is preferably inorganic. The hard-mask material may be dielectric, but may also be conductive, for example, TiN can also be used as the hard-mask material.

Depending on the starting thickness of the mask and the etching process used, a residue of this hard mask remains as a "covering" of the interconnects after the metal patterning. This residue is integrated in the subsequent dielectric layer that is deposited. However, according to the present invention the interconnects can also be covered using alternate processes.

Figure 1B:
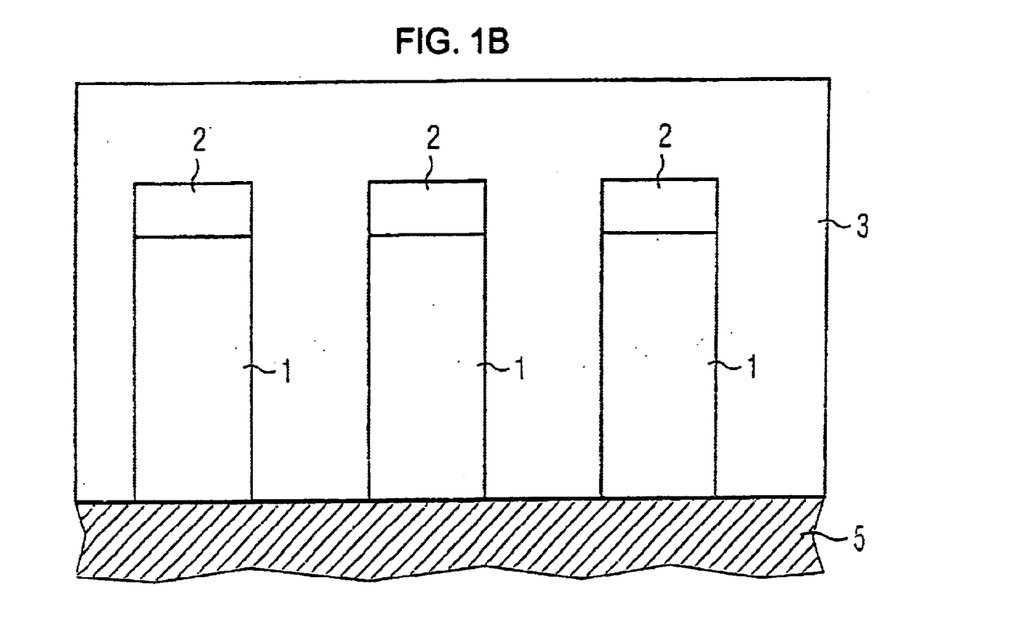
Figure 1C:
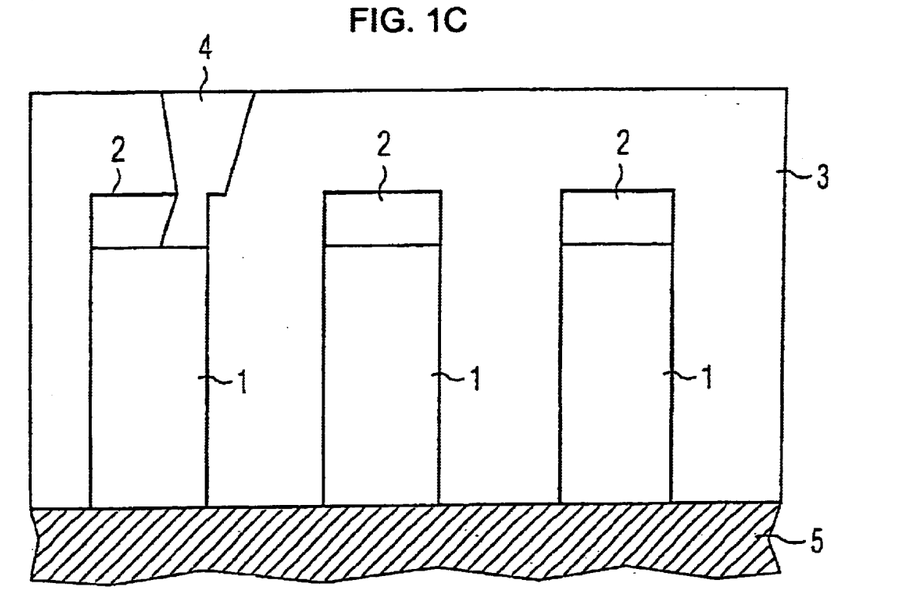

Then, as shown in FIG. 1B, a dielectric layer 3 is applied to the metallization structure 1 with the hard-mask layer 2 so that the surfaces of the sections of the hard-mask layer 2 are completely covered by the dielectric layer 3. The dielectric layer 3 consists of a different material than the hard-mask layer 2.

Then, a two-stage process for etching the contact holes 4 is carried out. First of all, the contact holes 4 are etched in the dielectric material 3, and this step is ended as soon as the hard-mask layer 2 is reached. This can be effected, for example, by using time control or by using automatic end-point detection. Then, the hard-mask layer 2 is etched selectively with respect to the dielectric layer 3, i.e. an etching process that only etches the hard-mask layer 2, but not the dielectric layer 3 is used. This prevents the contact hole from breaking out toward the adjacent interconnect, as shown in FIG. 2A, and the result is the contact hole having the profile illustrated in FIG. 1C. The fact that the second stage of the etching process preferably takes place partially isotropically also increases the cross section of the contact hole compared to the cross section after the first stage has ended, so that the electrical resistance of the completed contact remains low.

According to a preferred embodiment of the present invention, the second stage of the etching process takes place partially isotropically, i.e. not with precisely the same etching rate in all directions, but rather with a greater etching rate in the direction perpendicular to the substrate surface than in the direction parallel to the substrate surface. The relative etching rate in the direction parallel to the substrate surface is greater than in the first stage of the etching process. As a result, the cross section of the contact holes increases in the direction of the substrate surface.

Figure 1D:
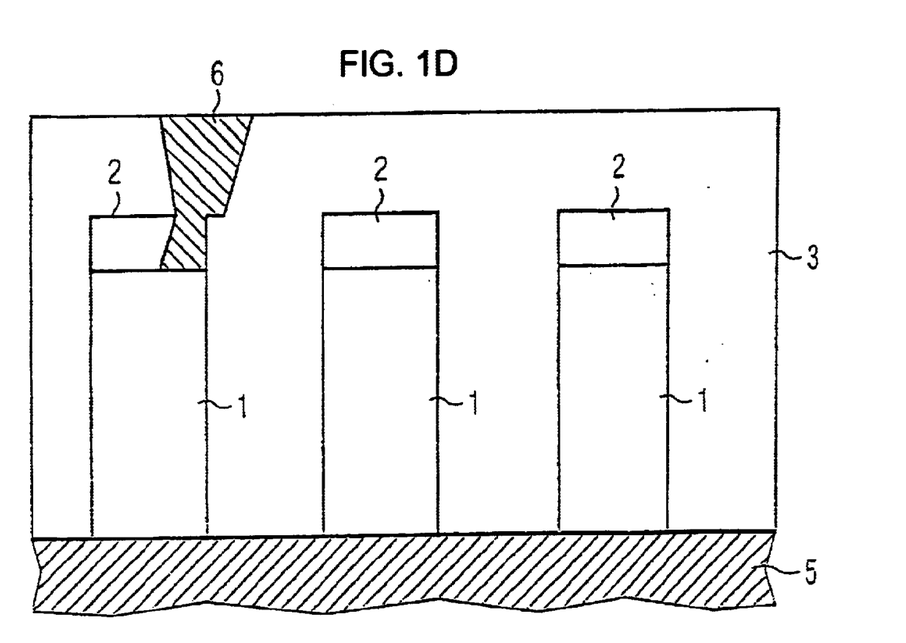

As shown in FIG. 1D, the contact hole is then filled with an electrically conductive material 6, in particular metal. It is clearly apparent that the risk of short circuits is drastically reduced on account of the two-stage etching process in which etching is carried out selectively during the second etching step.

The concept on which the present invention is based can be implemented in a large number of process variants. In this context, it is important for sections of a hard-mask material to be arranged directly on the interconnects. This hard-mask material is different than the dielectric material that completely covers at least the surfaces of the hard-mask material so that the two-stage etching process can be carried out as explained above.

By way of example, the interconnects can be patterned using a process with which a metal layer is applied to the entire surface. Then a hard-mask material 2 is applied and is photolithographically patterned, and finally the metal layer is etched, for example, using a reactive ion etching process, resulting in the structure shown in FIG. 1A. After the dielectric layer has been applied, the layer structure shown in FIG. 1B likewise results.

In accordance with the present invention, the dielectric layer may be composed of what is known as a low-k material, i.e. of a material with a low dielectric constant, for example, lower than 4. Examples of such materials include carbon-doped silicon oxide (SICOH), which is deposited, for example, using a CVD (chemical vapor deposition) process, and silicon oxide that is doped with halogens, such as for example, fluorine, spin-on polymer films and others which are generally known.

The use of materials with a low dielectric constant of this type is advantageous in particular because they can be used to minimize the mutual capacitive coupling of the interconnects.

Dielectric materials, such as for example $SiO_2$, $Si_3N_4$, SiON and others, are particularly suitable for the hard-mask layer. However, it is also possible to use conductive layers, such as for example TiN.

However, it is obvious that the present invention can be carried out with any desired combination of a hard-mask layer and a dielectric layer, provided that the hard-mask layer and the dielectric layer differ from one another and the hard-mask layer can be etched selectively with respect to the dielectric layer. In this context, the term "selectively" means that the etching rates differ greatly for the two materials. The etching-rate ratios are typically 1:3 to 1:10, i.e. the hard-mask layer is etched at an etching rate which is at least three times as high as that of the dielectric layer.

The step of determining that the hard-mask layer has been reached is also particularly important in the inventive process. If this step were to be dispensed with and the dielectric layer were simply etched selectively with respect to the hard-mask layer, the contact hole would break out toward the adjacent interconnect, as shown in FIG. 2A. The fact that one detects that the hard-mask layer has been reached, and as a function of this, ends the first etching stage, greatly limits the lateral extent of the contact hole.

According to a preferred embodiment of the present invention, it can be recognized that the hard-mask layer has been reached as a result of the elapse of a preset, previously empirically determined etching time.

Alternatively, it is also possible to analyze the composition of the etching products. This can be achieved, for example, by a spectral analysis of the etching plasma. If the hard-mask layer is reached during the etching process, the composition of the etching products that are formed changes. Accordingly, new spectral lines are produced and existing ones disappear. It can then be detected that the hard-mask layer has been reached by monitoring the intensity of certain spectral lines which are in each case well known to the person skilled in the art.

Overall, the inventive process provides the following advantages:

The fact that the hard-mask layer is etched selectively with respect to the dielectric layer during the second etching step prevents the contact hole from breaking out into the dielectric layer, and short circuits between adjacent interconnects or contact holes are avoided.

Consequently, interconnects can be arranged more closely together without impairing performance and reliability.

If the second etching step is carried out partially isotropically, it is possible to achieve a contact-hole diameter at the bottom of the contact hole that approximately corresponds to the diameter that was originally defined by lithography. Therefore, the misalignment of the lithography mask is compensated for. Furthermore, the contact area between the contact hole and the interconnect is increased in size compared to unlanded contacts, in which a horizontal proportion of the contact hole does not land on an interconnect, with the result that the connection resistance is reduced and the nucleation during application of the electrically conductive connecting material is facilitated.

However, the misalignment of the lithography mask is also substantially compensated for if the second etching step is not carried out isotropically, since in this case defect-free contact is made with the interconnects.

Accordingly, it is possible to relax the demands imposed on the overlay, and consequently less reworking of the lithography is required and ultimately the manufacturing costs are reduced.

Furthermore, the distances between the interconnects can be reduced without there being any risk of short circuits.

Now a detailed exemplary embodiment will be explained. First of all, a metallization structure including an aluminum-copper alloy is formed on a substrate surface 5 by depositing an AlCu layer, with a small addition of copper amounting to approximately 0.5%, over the entire surface using known processes. Then, an $SiO_2$ layer is deposited over the entire surface as the hard-mask material. After a photoresist layer has been applied, the photoresist layer is patterned photolithographically using a mask, and then known processes are used first to etch the hard-mask layer 2 on the basis of the resist mask which results and then to remove the photoresist layer again. Then a reactive ion etching process is carried out in order to etch the AlCu layer at the uncovered regions, and this is followed by a passivation treatment of the produced interconnects, so that ultimately the structure shown in FIG. 1A results. A hard-mask material layer thickness of approximately 100 to 150 nm (nanometers) remains.

Figure 3A:
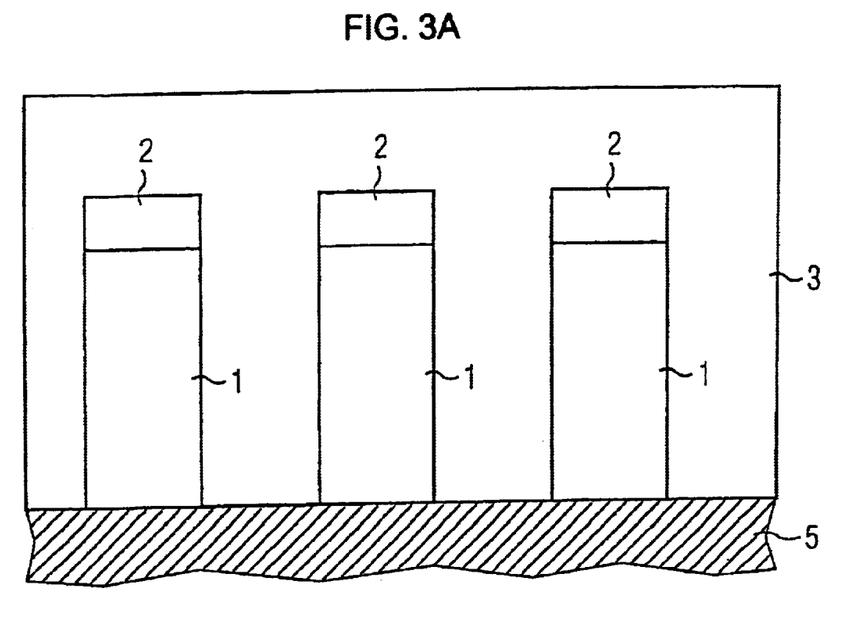
FIGS. 3A to 3D diagrammatically depict an exemplary embodiment of the present invention.

Then, the inventive process for producing contact holes on the metallization structure that has just been produced is carried out. First of all, carbon-doped $SiO_2$, which on account of its low dielectric constant is known as a low-k dielectric, is deposited as a dielectric layer 3 using a CVD process in order to insulate adjacent metallization levels. The use of this dielectric is particularly advantageous, since it is easy to integrate and has high gap-fill properties. The dielectric layer 3 is applied in such a way that the spaces between adjacent interconnects are completely filled, and finally the interconnects together with the residues of the hard-mask material 2 are covered with the dielectric layer 3 so that adjacent metallization levels are electrically insulated from one another, as shown in FIG. 3A.

Typically, the resulting surface is then polished by chemical mechanical polishing (CMP), in order to compensate for topography differences and to level the surface of the dielectric layer 3.

Figure 3B:
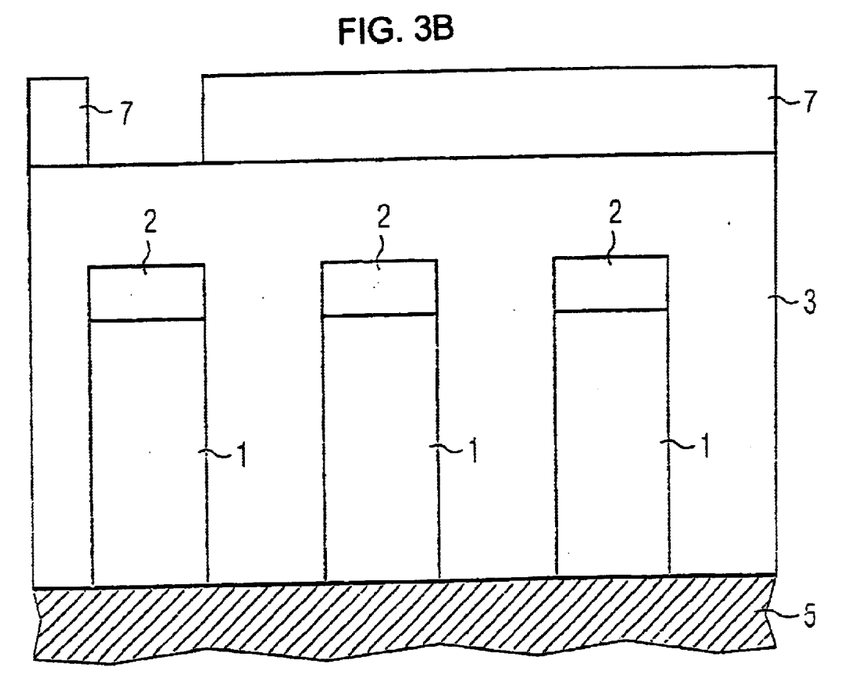
Figure 3C:
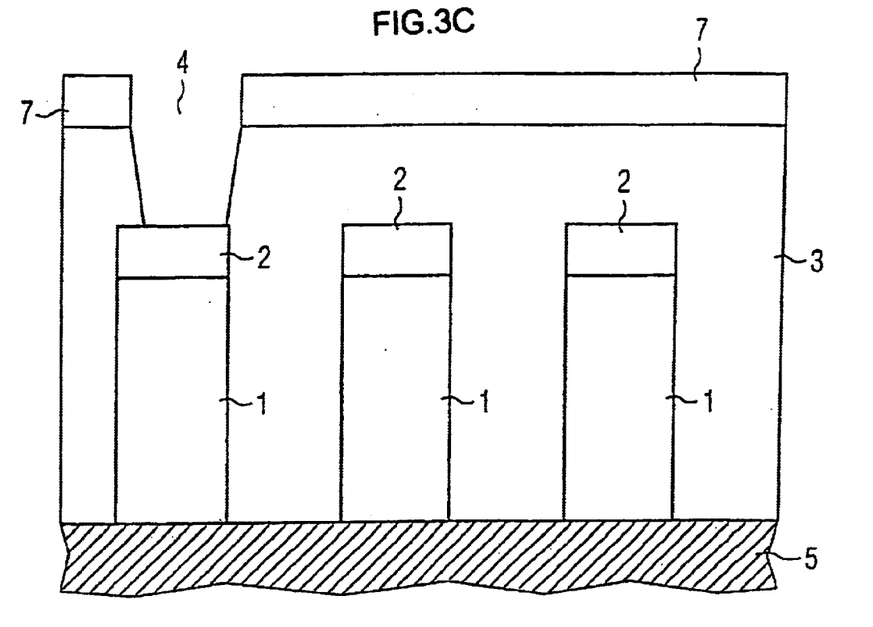

Then, to define the contact holes, first of all a photoresist layer 7 is applied to the entire surface and is then patterned photolithographically using a mask, as shown in FIG. 3B. In this step, misalignment of the mask is generally inevitable, and consequently the contact holes produced in the photoresist material 7 may also be slightly offset laterally with respect to the interconnects. The misalignment is typically approximately 30 to 80 nm. Then, the step of etching contact holes 4 through the dielectric layer 3 is carried out, as shown in FIG. 3C. This step is ended as soon as the hard-mask material has been reached; however, etching is not necessarily selective with respect to the hard-mask material. Etching is usually carried out by a dry-etching process, for example, using $C_4F_8$ in an $Ar/O_2/C_4F_8/N_2$ plasma, either with automatic end point detection or after a preset etching time. In this case, the selectivity of the etching can be adjusted using the oxygen content of the etching-gas mixture. The higher the oxygen content, the greater the etching rate for the C-doped $SiO_2$.

The etching process may take place isotropically or anisotropically. An anisotropic etching process that produces either contact-hole walls that run substantially vertically or that produces a slightly tapering contact-hole diameter with a difference in diameter between the upper diameter and lower diameter of approximately 30 nm is preferred. At the base, the contact-hole diameter is typically approximately 150 to 300 nm, depending on the metallization level and the technology generation.

As has been mentioned above, it can be determined that the hard-mask layer has been reached, for example, as a result of the preset etching time having elapsed. Alternatively, however, automatic end-point detection may also take place. This is based in particular on the fact that, when the hard-mask layer is reached, other etching products are suddenly produced or the etching rate changes, with the result that the quantity and composition of the etching products formed are also changed.

Figure 3D:
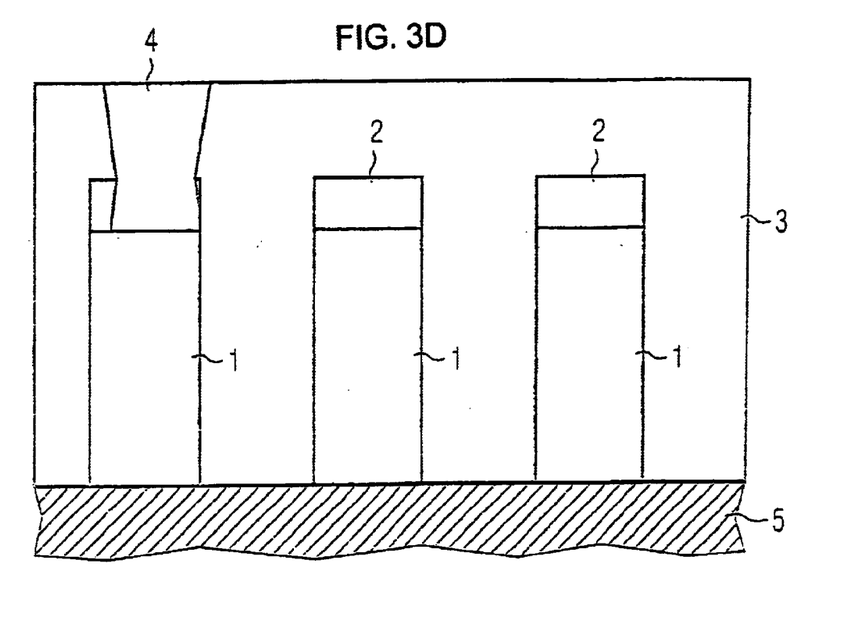

After the first etching step has ended, an etching process which etches the hard-mask layer 2 selectively with respect to the dielectric layer 3 is carried out, as shown in FIG. 3D. By way of example, $SiO_2$ serving as the hard-mask material can be etched selectively with respect to carbon-doped $SiO_2$ using the etching-gas mixture used above, including $C_4F_8$ in an $Ar/O_2/C_4F_8/N_2$ plasma. The selectivity of the etching, at an oxygen content of 25% is, for example, 4:1, i.e. on blank wafers an $SiO_2$ etching rate of approximately 360 nm/min was measured, while the etching rate of carbon-doped $SiO_2$ is approximately 80 nm/min. The selectivity of the etching can be controlled by way of the $O_2$ content in the etching gas and is highest for an $O_2$ content of 0.

Using this combination of the hard-mask material and the dielectric layer is particularly advantageous since, with the described etching-gas mixture of $C_4F_8$ in an $Ar/O_2/C_4F_8/N_2$ plasma, at an oxygen content of 60%, the etching rate for undoped $SiO_2$ is 120 nm/min and for the C-doped $SiO_2$ is 360 nm/min. Consequently, the first and second etching stages can be carried out using the same etching gases but in each case different oxygen contents. In particular, when the hard-mask layer is reached, only the oxygen content of the etching gas has to be changed in order to carry out the second etching stage.

Similar etching-rate ratios are also found when SiON is used as the hard-mask material. Alternatively, however, it is also possible for any desired hard-mask materials, in particular, $Si_3N_4$ and all possible intermediate forms between pure $SiO_2$ and pure $Si_3N_4$, to be used.

Other fluorine-containing etching gases can also be used for selective etching.

This selective etching step preferably takes place partially isotropically, so that the landing area on the interconnects is increased, with the result that the contact resistance is reduced, and depending on the electrically conductive connecting material used, nucleation is facilitated. After completely etching the contact holes, the remaining photoresist mask 7 is removed from the surface.

The production of the contacts is ended by introducing an electrically conductive material, for example, tungsten, into the etched contact holes using known processes. For this purpose, first of all a Ti/TiN liner serving as a bonding agent is deposited by sputtering. Then, tungsten is deposited using a CVD process, and the excess contact-hole material including tungsten and Ti/TiN is removed by polishing, so that only conductive material remains in the contact holes.

I claim:

1. A process for producing contact holes on a metallization structure, which comprises:
    providing the metallization structure with at least one interconnect having a surface covered with a section of a hard-mask layer and configuring the metallization structure on a substrate surface;
    applying a dielectric layer including a material with carbon so that at least a surface of the section of the hard-mask layer is surrounded by the dielectric layer;
    etching contact holes through the dielectric layer in a first etch step using an etching-gas mixture including $C_4F_8$ and oxygen having a first oxygen concentration;
    making a determination that the hard-mask layer has been reached;
    in dependence on the determination, ending the first etch step and starting a second etch step using an etching-gas mixture including $C_4F_8$ and oxygen having a second oxygen concentration; and
    while performing the second etch step, selectively etching the hard-mask layer with respect to the dielectric layer and selecting the second oxygen concentration to increase a selectivity at which the hard-mask layer is being etched with respect to the dielectric layer.

2. The process according to claim 1, wherein the step of providing the metallization structure includes:
    applying a metal layer to all of the substrate surface,
    applying the hard-mask layer to all of the substrate surface,
    patterning the hard-mask layer so that the interconnect that will be formed is covered by the hard-mask layer, and
    etching the metal layer.

3. The process according to claim 1, wherein: the dielectric layer includes a material with a dielectric constant of less than 4.

4. The process according to claim 1, wherein: the step of etching the contact holes through the dielectric layer takes place anisotropically.

5. The process according to claim 1, wherein: the step of selectively etching the hard-mask layer takes place partially isotropically.

6. The process according to claim 1, wherein: the dielectric layer includes a material selected from a group consisting of carbon-doped silicon oxide, halogen-doped silicon oxide, and a polymer film.

7. The process according to claim 1, wherein: the step of ending the etching of the contact holes through the dielectric layer takes place after a preset time.

8. The process according to claim 1, wherein:
   the step of making the determination that the hard-mask layer has been reached includes determining a composition of etching products; and
   the step of ending the etching of the contact holes through the dielectric layer takes place as a function of the composition of the etching products.

9. The process according to claim 1, which comprises:
   after the step of selectively etching the hard-mask layer, depositing electrically conductive material.

10. The process according to claim 1, wherein:
    the etching-gas mixture includes $C_4F_8$, Ar, $O_2$, $N_2$ during the first etch step.

11. The process according to claim 1, wherein:
    the hard-mask layer is undoped $SiO_2$ and the dielectric layer comprises carbon-doped $SiO_2$.

12. The process according to claim 1, wherein:
    the hard-mask comprises is a non-carbon containing material.

* * * * *